United States Patent
Chen et al.

(10) Patent No.: US 11,133,231 B2
(45) Date of Patent: Sep. 28, 2021

(54) CMP APPARATUS AND METHOD FOR ESTIMATING FILM THICKNESS

(71) Applicant: TAIWAN SEMICONDUCTOR MANUFACTURING COMPANY LTD., Hsinchu (TW)

(72) Inventors: Yu-Min Chen, Tainan (TW); Chin-Wei Liang, Hsinchu County (TW); Sheng-Chau Chen, Tainan (TW); Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 487 days.

(21) Appl. No.: 15/937,245

(22) Filed: Mar. 27, 2018

(65) Prior Publication Data
US 2019/0157170 A1    May 23, 2019

Related U.S. Application Data

(60) Provisional application No. 62/588,709, filed on Nov. 20, 2017.

(51) Int. Cl.
| | |
|---|---|
| H01L 21/66 | (2006.01) |
| H01L 21/306 | (2006.01) |
| B24B 37/013 | (2012.01) |
| H01L 31/18 | (2006.01) |
| B24B 49/10 | (2006.01) |

(Continued)

(52) U.S. Cl.
CPC ............ *H01L 22/26* (2013.01); *B24B 37/013* (2013.01); *B24B 49/04* (2013.01); *B24B 49/10* (2013.01); *G01N 17/02* (2013.01); *H01L 21/30625* (2013.01); *H01L 31/18* (2013.01); *H01L 22/14* (2013.01)

(58) Field of Classification Search
CPC ....... B24B 37/013; B24B 49/02; B24B 49/04; B24B 49/045; B24B 49/10; H01L 21/3065; H01L 31/18; H01L 22/12; H01L 22/14; H01L 22/26; H01L 22/34; G01B 7/085; G01B 7/087
USPC .................. 451/5, 8, 10, 11, 41; 438/14–17; 324/600, 602, 662, 671, 699, 71.1
See application file for complete search history.

(56) References Cited

U.S. PATENT DOCUMENTS 5,081,421 A * 1/1992 Miller ................... B24B 37/013
                                                          324/671
5,559,428 A * 9/1996 Li ............................. G01B 7/10
                                                          324/71.5

(Continued)

*Primary Examiner* — Eileen P Morgan
*Assistant Examiner* — Marcel T Dion
(74) *Attorney, Agent, or Firm* — WPAT, P.C.; Anthony King

(57) ABSTRACT

A method for estimating film thickness in CMP includes the following operations. A substrate with a film formed thereon is disposed over a polishing pad with a slurry dispensed between the film and the polishing pad. A CMP operation is performed to reduce a thickness of the film. An in-situ electrochemical impedance spectroscopy (EIS) measurement is performed during the CMP operation by an EIS device to estimate the thickness of the film real-time. The CMP operation is ended when the estimated thickness of the film obtained from the fit parameters of the first equivalent electrical circuit model reaches a target thickness.

20 Claims, 14 Drawing Sheets

(51) Int. Cl.
*B24B 49/04* (2006.01)
*G01N 17/02* (2006.01)

(56) References Cited

U.S. PATENT DOCUMENTS

| | | | | |
|---|---|---|---|---|
| 5,846,398 A * | 12/1998 | Carpio | ............... | B24B 37/04 |
| | | | | 205/775 |
| 6,020,264 A * | 2/2000 | Lustig | ............... | B24B 37/013 |
| | | | | 438/692 |
| 6,214,732 B1 * | 4/2001 | Easter | ............... | B24B 37/013 |
| | | | | 257/E21.304 |
| 6,599,765 B1 * | 7/2003 | Boyd | ............... | B24B 37/205 |
| | | | | 356/630 |
| 6,641,470 B1 * | 11/2003 | Zhao | ............... | B24B 37/205 |
| | | | | 451/10 |
| 7,012,438 B1 * | 3/2006 | Miller | ............... | H01L 22/12 |
| | | | | 257/E21.53 |
| 9,530,617 B2 * | 12/2016 | Wu | ............... | H01J 37/32935 |
| 2006/0025052 A1 * | 2/2006 | Birang | ............... | B24B 49/105 |
| | | | | 451/5 |
| 2007/0103150 A1 * | 5/2007 | Tada | ............... | G01B 7/105 |
| | | | | 324/229 |
| 2008/0242195 A1 * | 10/2008 | Heinrich | ............... | B24B 37/013 |
| | | | | 451/6 |
| 2012/0293188 A1 * | 11/2012 | Nikolenko | ............... | G01B 7/10 |
| | | | | 324/655 |
| 2013/0231032 A1 * | 9/2013 | Swedek | ............... | B24D 11/02 |
| | | | | 451/527 |

* cited by examiner

CMP APPARATUS AND METHOD FOR ESTIMATING FILM THICKNESS

CROSS-REFERENCE TO RELATED APPLICATION

This application claims the benefit of U.S. Provisional Application No. 62/588,709, filed on Nov. 20, 2017, which is incorporated by reference in its entirety.

BACKGROUND

Semiconductor devices are often fabricated through multiple operations, for example, chemical-mechanical planarization (CMP), etching, etc. A CMP operation is often used for reducing the thickness and planarizing the surface of a film of a substrate with a combination of chemical and mechanical forces. Mechanical grinding alone causes many surface damages, while wet etching alone cannot attain good planarization. The CMP operation involves both the mechanical grinding and the wet etching to generate a smooth surface for the film.

However, the CMP suffers some issues. For example, the CMP operation cannot be stopped accurately because the thickness of the film during the CMP operation is difficult to estimate in time, particularly when a thin target thickness of the film is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
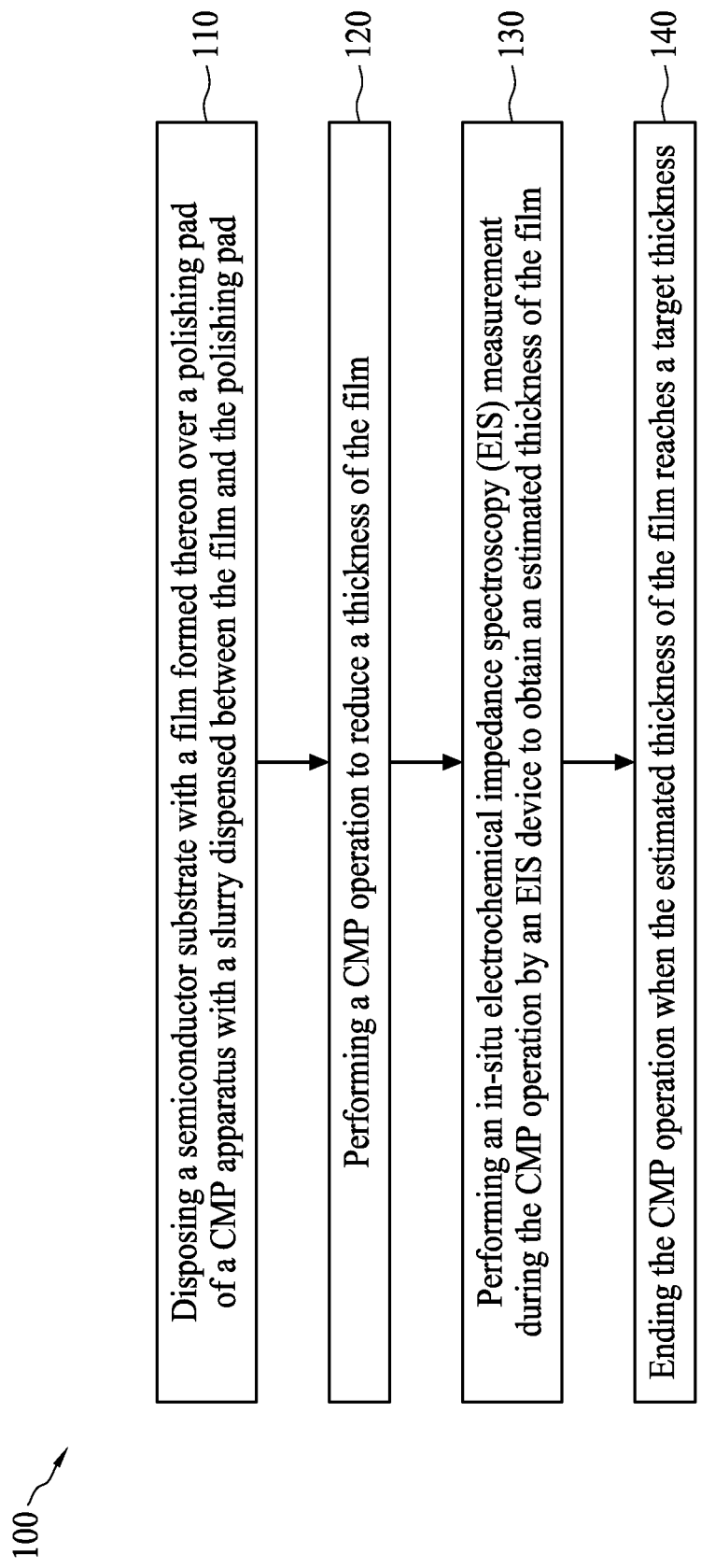
FIG. 1 is a flowchart illustrating a method for estimating film thickness during chemical-mechanical planarization (CMP) operation in accordance with some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As used herein, a "substrate" refers to a substrate on which various layers and device structure are formed. The substrate may include a semiconductor substrate. In some embodiments, the substrate may include a bulk substrate. The material of the substrate may include elementary semiconductor material such as silicon, or a compound semiconductor material, such as GaAs, InP, Si/Ge, or SiC. In some embodiments, the substrate may include a composite substrate such as a silicon on insulator (SOI) substrate.

As used herein, electrochemical impedance spectroscopy (EIS) refers to a tool for the analysis of a complex electrochemical system. A complex electrochemical system is an electrochemical system including a combination of various electrical elements such as resistor, capacitor, inductor and/or constant phase element (CPE). The impedance values of resistance, capacitance, inductance and/or CPE exhibit a non-linear behavior. In an EIS analysis, an alternating voltage is applied to the complex electrochemical system at different frequencies, and the resulting current through the complex electrochemical system is measured to obtain an impedance data. By matching the impedance data with different equivalent electrical circuit models, a combination of impedances in the complex impedance and how they are connected may be obtained. In some embodiments of the present disclosure, the complex electrochemical system is formed by an electrical circuit path constituted from the slurry and the film.

As used herein, the term "in-situ EIS measurement" refers to an EIS measurement is executed in the course of the CMP operation. The in-situ EIS measurement is repeatedly performed during the CMP operation so as to obtain the impedance data of the complex electrochemical system formed by the slurry and the film in a real-time manner. In such case, the actual thickness of the film can be estimated in time based on the impedance data, and the CMP operation can be controlled accordingly.

As used herein, a constant phase element (CPE) refers to a non-ideal capacitor whose impedance does not behave ideally as an ideal capacitor. The impedance of a CPE or a capacitor can be expressed as:

$$Z = \frac{1}{(j\omega)^\alpha Q}$$

where
Z is the impedance of the CPE or the capacitor;
j is an imaginary unit;
ω is a radial frequency;
α is a first fit parameter, wherein α equals 1 for a capacitor, and α is less than 1 and greater than 0 for a CPE; and Q is a second fit parameter representing the capacitance for a capacitor or a CPE.

In one or more embodiments, a chemical-mechanical planarization (CMP) apparatus and a method for estimating film thickness are provided. An EIS device is incorporated in the CMP apparatus and configured to in-situ obtain an impedance data of a complex electrochemical system formed from the film to be polished and the slurry for polishing the film. The impedance data may be fitted to a predetermined equivalent electrical circuit model. When the impedance data fits to the predetermined equivalent electrical circuit model, the thickness of the film can be estimated by an equation derived from the predetermined equivalent electrical circuit model. The EIS analysis is executed repeatedly during the CMP operation. The impedance data vary due to the changes in thickness, and the thickness of the film can be real-time estimated. As the estimated thickness of the film reaches the target thickness, the CMP operation can be stopped promptly. The thickness of the film is estimated based on the impedance data of the complex electrochemical system formed between the film and the slurry, and therefore can be applied to an CMP operation for planarizing a film without an etching top layer. The EIS is an analysis tool which can accurately analyze the impedance data, and thus the thickness of the film during the CMP operation can be accurately estimated, even when the target thickness of the film is thin. Compared to other measurement methods, the EIS analysis can accurately estimate thickness of the film even when the film is thin. For example, the EIS analysis is applicable in estimating a film with a thickness less than 100 nm.

Referring to FIG. 1, FIG. 1 is a flowchart illustrating a method for estimating film thickness during chemical-mechanical planarization (CMP) operation in accordance with some embodiments of the present disclosure. As shown in FIG. 1, the method 100 begins with operation 110 in which a substrate with a film formed thereon is disposed over a polishing pad of a CMP apparatus with a slurry dispensed between the film and the polishing pad. The method 100 proceeds with operation 120 in which a CMP operation is performed to reduce a thickness of the film. The method 100 continues with operation 130 in which an in-situ electrochemical impedance spectroscopy (EIS) measurement is performed during the CMP operation by an EIS device to obtain an estimated thickness of the film. The method 100 proceeds with operation 140 in which the CMP operation is ended when the estimated thickness of the film reaches a target thickness.

Figure 2:
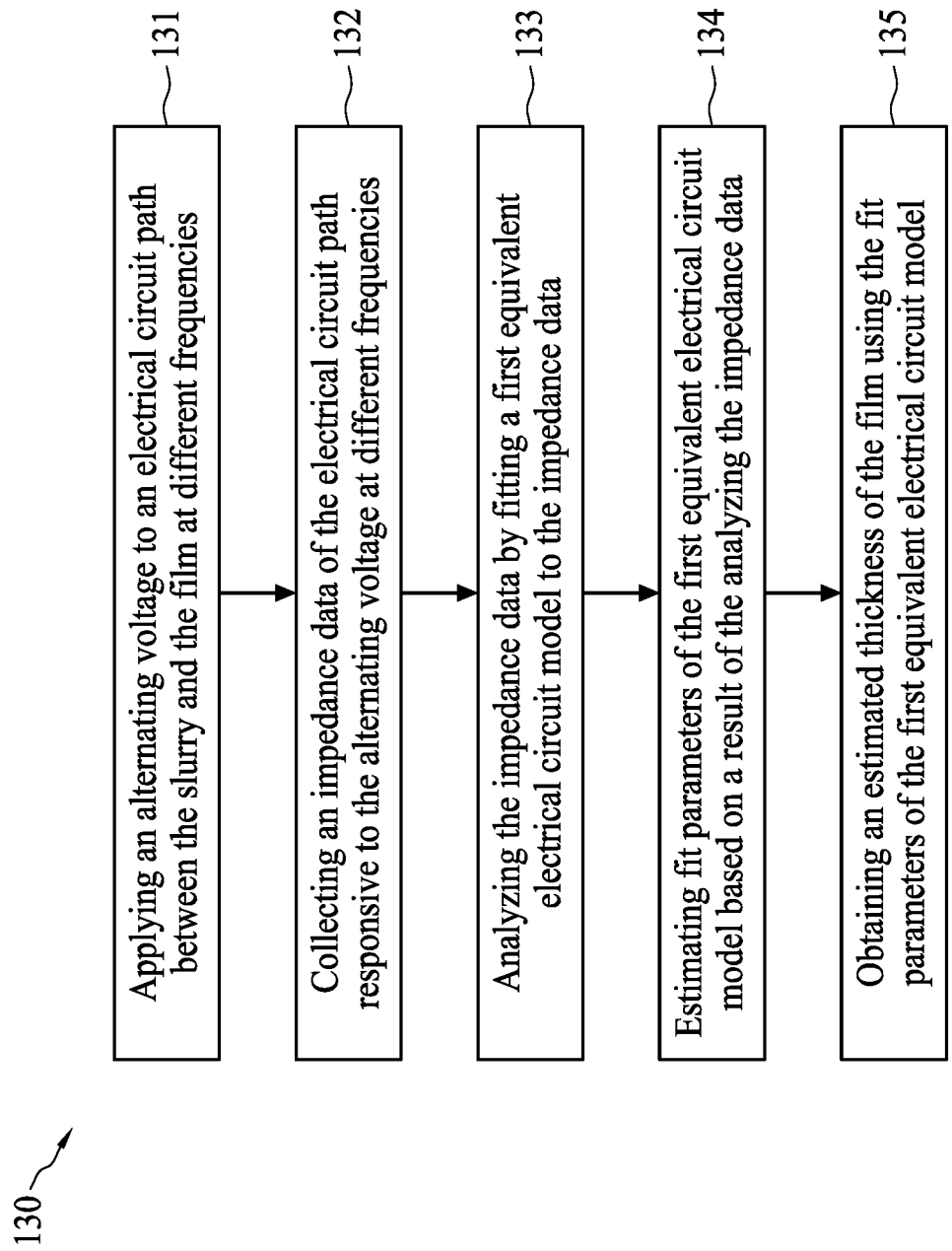
FIG. 2 is a flowchart illustrating sub-operations of the in-situ EIS measurement in accordance with some embodiments of the present disclosure.

Referring to FIG. 2, FIG. 2 is a flowchart illustrating sub-operations of the in-situ EIS measurement in accordance with some embodiments of the present disclosure. As shown in FIG. 2, the EIS measurement in operation 130 of the method 100 may proceed with sub-operation 131 in which an alternating voltage at different frequencies is applied to an electrical circuit path between the slurry and the film. The EIS measurement in operation 130 of the method 100 may continue with sub-operation 132 in which an impedance data of the electrical circuit path responsive the alternating voltage at different frequencies are collected. The EIS measurement in operation 130 of the method 100 may continue with sub-operation 133 in which the impedance data are analyzed by fitting a first equivalent electrical circuit model to the impedance data. The EIS measurement in operation 130 of the method 100 may proceed with sub-operation 134 in which fit parameters of the first equivalent electrical circuit model are estimated based on a result of the analyzing the impedance data. The EIS measurement in operation 130 of the method 100 may proceed with sub-operation 135 in which an estimated thickness of the film using the fit parameters of the first equivalent electrical circuit model is obtained.

The method 100 is merely an example, and is not intended to limit the present disclosure beyond what is explicitly recited in the claims. Additional operations and/or sub-operations can be provided before, during, and after the method 100, and some operations described can be replaced, eliminated, or moved around for additional embodiments of the method.

Figure 3A:
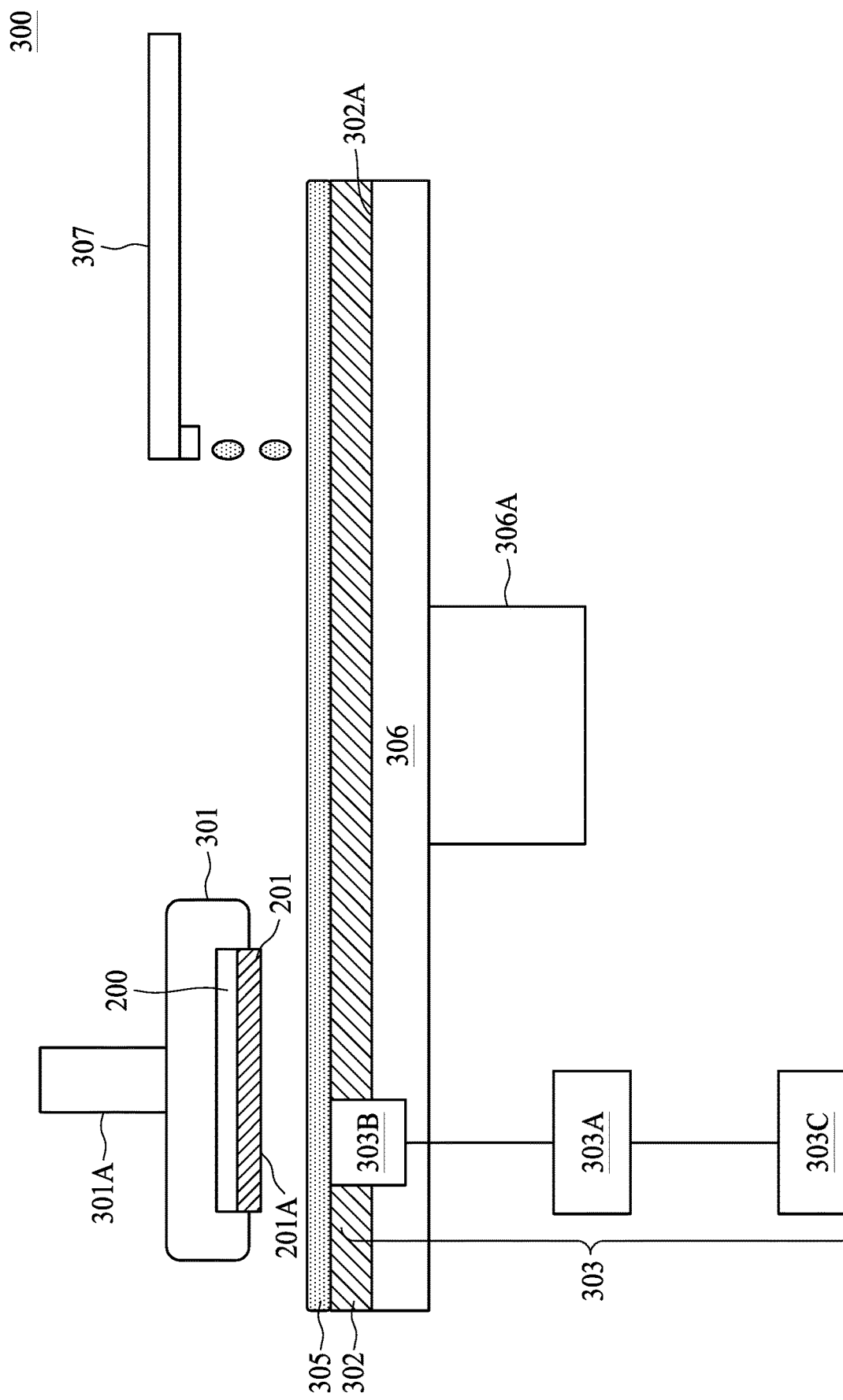
FIG. 3A and FIG. 3B are schematic views of a CMP apparatus at different stages of the CMP operation in accordance with some embodiments of the present disclosure.
Figure 3B:
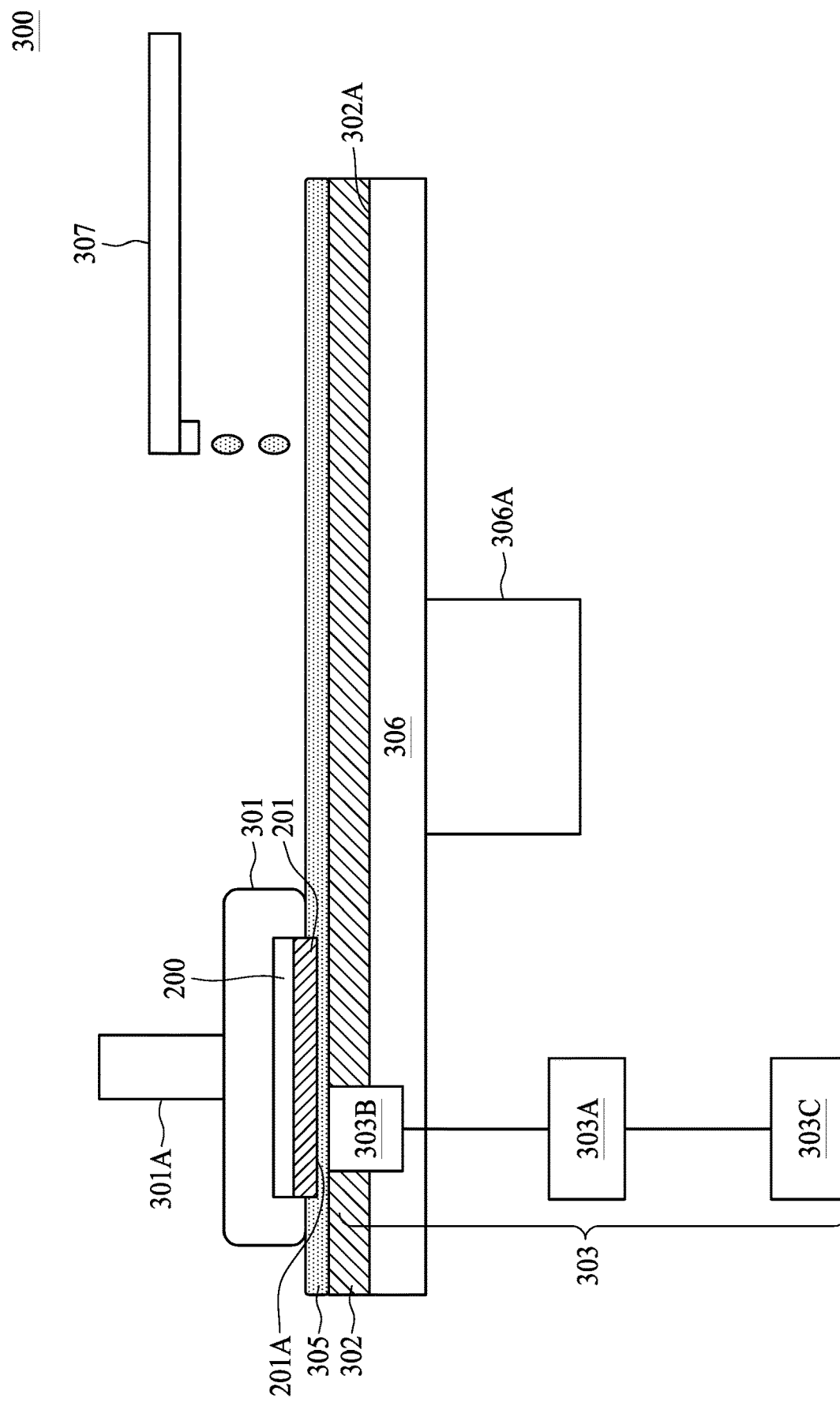

FIG. 3A and FIG. 3B are schematic views of a CMP apparatus at different stages of the CMP operation in accordance with some embodiments of the present disclosure. Referring to FIG. 3A, the CMP apparatus 300 includes a polishing head 301, a platen 306, a polishing pad 302, a slurry delivery system 307, and an electrochemical impedance spectroscopy (EIS) device 303. The polishing head 301 is configured to hold a substrate 200 with a film 201 formed thereon. In some embodiments, the polishing head 301 may be rotated by a motor 301A. The platen 306 is disposed opposing the polishing head 301. For example, the platen 306 is disposed under the polishing head 301. The polishing pad 302 is supported by the platen 306, and in opposite to the film 201. In some embodiments, the platen 306 is rotated by a motor 306A. The slurry delivery system 307 is configured to supply a slurry 305 over the polishing pad 302. The slurry 305 includes chemical contents for providing etching effect during the CMP operation, and particles such as abrasives for providing mechanical polishing effect during the CMP operation. In some embodiments, the material of the film 201 may include dielectric material, conductive material, or semiconductor material. The composition of the slurry 305 may vary depending on the material of the film 201.

Referring to FIG. 3B, when the CMP operation is performed, the platen 306 and the polishing head 301 may be moved with respect to each other such that the substrate 200 held by the polishing head 301 and the polishing pad 302 supported by the platen 306 can approach to each other. By way of example, the platen 306 may be moved upwardly and/or the polishing head 301 may be moved downwardly, such that the substrate 200 held by the polishing head 301 and the polishing pad 302 supported by the platen 306 can approach to each other. During the CMP operation, the surface 201A of the film 201 is immersed in the slurry 305, such that the film 201 can be chemically etched. The polishing head 301 can be rotated by the motor 301A, and the platen 306 can be rotated by the motor 306A. Accordingly, the film 201 can be mechanically polished or grinded.

Figure 4:
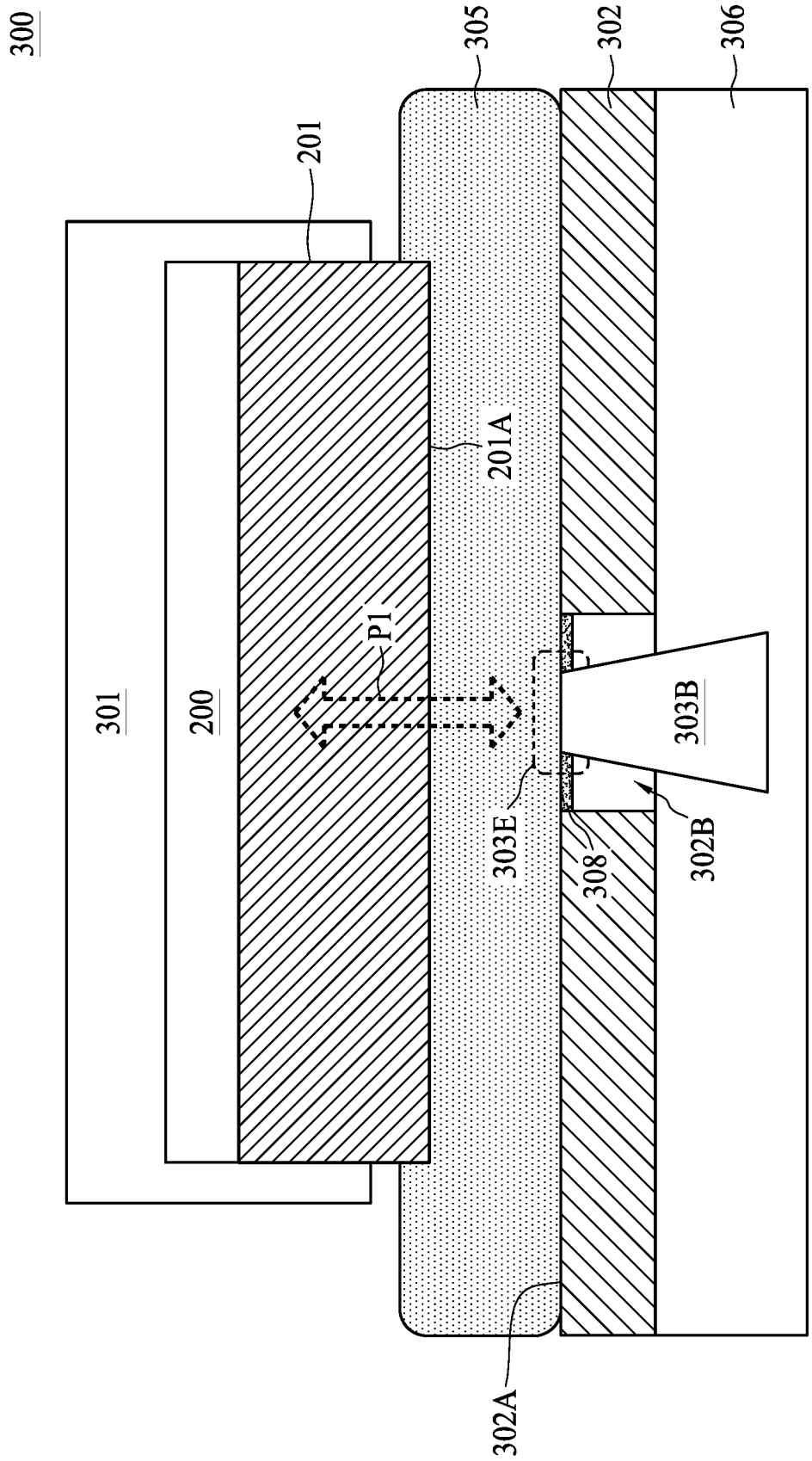
FIG. 4 is an enlarged schematic views of a CMP apparatus of FIG. 3B in accordance with some embodiments of the present disclosure.

FIG. 4 is an enlarged schematic views of a CMP apparatus of FIG. 3B in accordance with some embodiments of the present disclosure. As shown in FIG. 3B and FIG. 4, as the slurry 305 and the film 201 are in contact with each other during the CMP operation, an electrical circuit path P1 is formed between the slurry 305 and the film 201 during the CMP operation. The EIS device 303 is configured to in-situ obtain an impedance data of an electrical circuit path P1 in the slurry 305 and the film 201 during a CMP operation, and analyze the impedance data. Based on the result of the impedance data analysis, the thickness of the film 201 may be estimated.

In some embodiments, the EIS device 303 may include a power supplier 303A, a probe 303B and a processing unit 303C (e.g., illustrated in FIG. 3A/B). The power supplier 303A is configured to apply an alternating voltage to the electrical circuit path P1 between the slurry 305 and the film 201 at different frequencies. By way of example, the power supplier 303A may include a potentiostat, configured to supply a potential perturbation. The probe 303B is connected to the power supplier 303A and the slurry 305 during the CMP operation. The alternating voltage may be supplied to the electrical circuit path P1 through the probe 303B. The probe 303B may also be used to collect the impedance data of the electrical circuit path P1 in the slurry 305 and the film 201 responsive to the alternating voltage at different frequencies. In some embodiments, the probe 303B is arranged in the platen 306. The probe 303B may include an end 303E extending toward the polishing pad 302. The end 303E of the probe 303B may include electrode(s) to deliver and/or to receive signals. The end 303E of the probe 303B is exposed through a polishing surface 302A of the polishing pad 302 such that the end 303E may be in contact with the slurry 305, and able to deliver and/or to receive signals. In some embodiments, the probe 303B is disposed in an aperture 302B of the polishing pad 302. A sealing ring 308 may be arranged between the end 303E of the probe 303B and the polishing pad 302 to prevent the slurry 305 on the polishing surface 302A of the polishing pad 302 from leaking through the aperture 302B. The end 303E may be substantially coplanar to the polishing surface 302A or slightly lower than the polishing surface 302A to reduce adverse influence on the CMP operation. The processing unit 303C is connected to the power supplier 303A and the probe 303B, configured to analyze the impedance data. In some embodiments, the processing unit 303C may include a computer, or the like.

Figure 5:
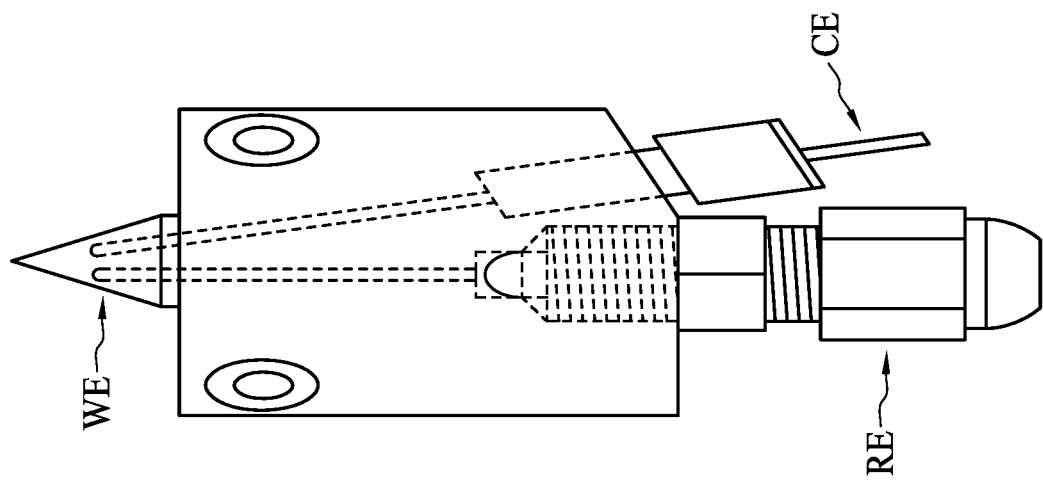
FIG. 5 is a schematic diagram illustrating a probe in accordance with some embodiments of the present disclosure.

FIG. 5 is a schematic diagram illustrating a probe in accordance with some embodiments of the present disclosure. As shown in FIG. 5, the probe 303B may include a working electrode WE configured to apply alternating voltage to the slurry 305, and a counter electrode CE configured to collect the impedance data responsive to the alternating voltage. In some embodiments, the probe 303B may further include a reference electrode RE configured to provide a reference voltage.

Figure 6:
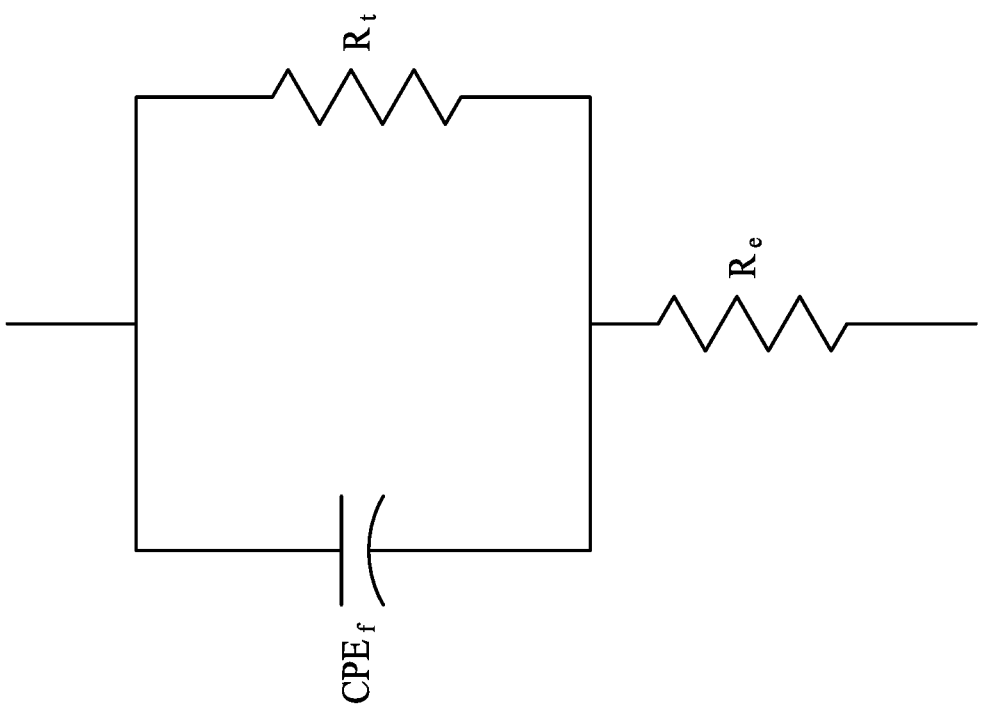
FIG. 6 depicts a first equivalent electrical circuit model of a complex electrochemical system in accordance with some embodiments of the present disclosure.

Referring to FIG. 6, FIG. 6 depicts a first equivalent electrical circuit model of a complex electrochemical system in accordance with some embodiments of the present disclosure. As shown in FIG. 6, the first equivalent electrical circuit model includes a slurry resistance $R_e$ of the slurry, a film constant phase element $CPE_f$ of the film and a film resistance $R_t$ of the film, where the slurry can be configured as an electrolyte. Theoretically, the impedance of the film in the first equivalent electrical circuit model can be expressed by equation (1):

$$Z = \frac{1}{(j\omega)^\alpha Q}, \tag{1}$$

where

Z is the impedance of the film CPE;

j is an imaginary unit;

ω is a radial frequency;

α is a first fit parameter of the first equivalent electrical circuit model, wherein 0<α<1;

and

Q is a second fit parameter of the first equivalent electrical circuit model.

In the first equivalent electrical circuit model of FIG. 6, a theoretical thickness of the film can be derived from equation (2):

$$\delta = \frac{(\epsilon\epsilon_0)^\alpha}{gQ\rho^{1-\alpha}}, \quad (2)$$

wherein

δ is the estimated thickness of the film;

g is a parameter equal to $1+2.88(1-\alpha)^{2.375}$;

ε is a dielectric constant of the film;

$\epsilon_0$ is the permittivity of vacuum; and

ρ is a resistivity at film-slurry interface.

Figure 7:
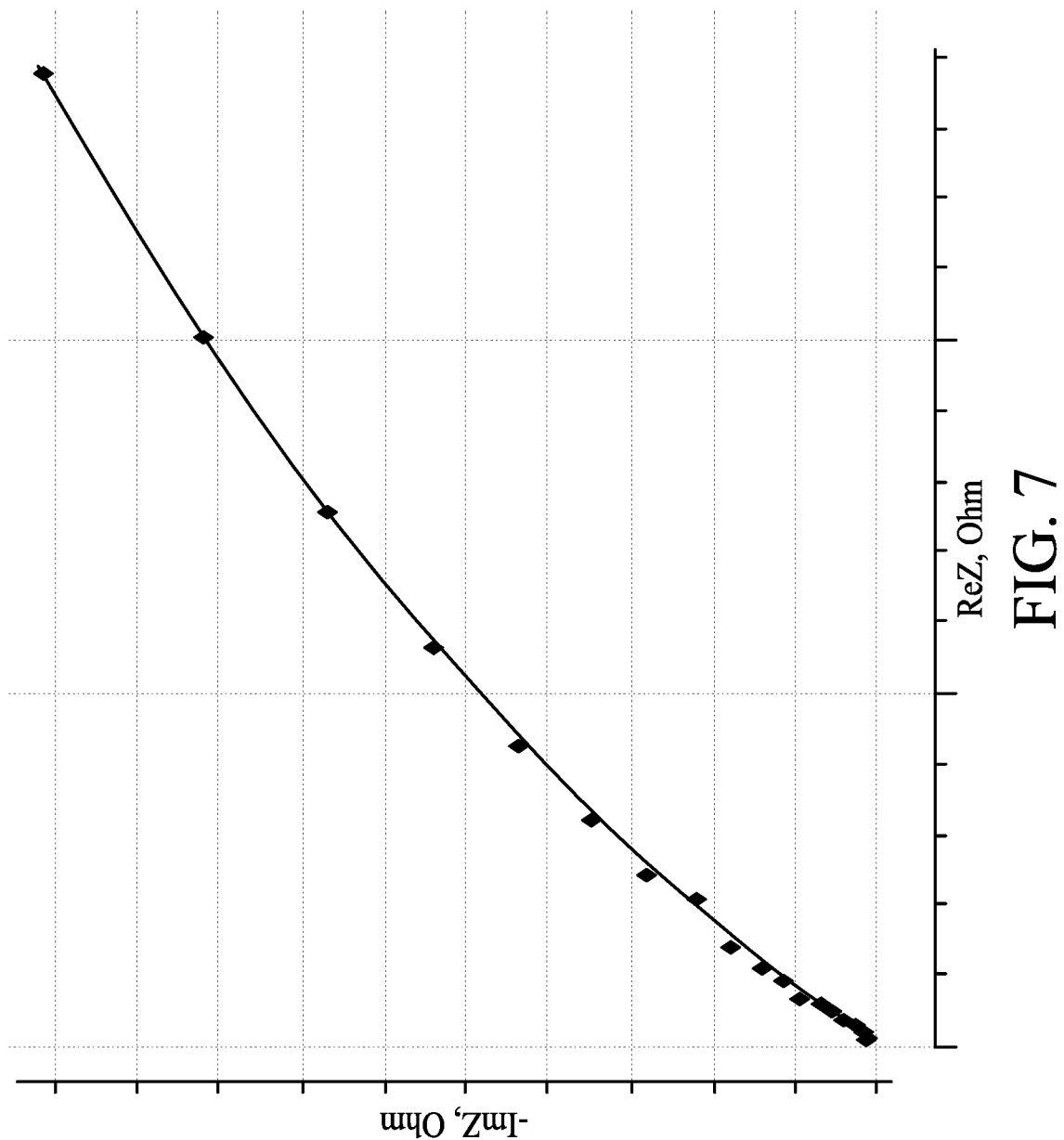
FIG. 7 is a schematic Nyquist plot of a first equivalent electrical circuit model of a complex electrochemical system in accordance with some embodiments of the present disclosure.

Refer to FIG. 7. FIG. 7 is a schematic Nyquist plot of a first equivalent electrical circuit model of a complex electrochemical system in accordance with some embodiments of the present disclosure. As shown in FIG. 7, the Nyquist plot of the first equivalent electrical circuit model as depicted in FIG. 6 is a curve substantially having a shape of a ⅛ circle or a ¼ circle, and the curve can be expressed by equation (1). If the impedance data of the electrical circuit path in the slurry and the film collected during the CMP operation fits to the Nyquist plot of the first equivalent electrical circuit model by curve fitting, the electrical circuit path in the slurry and the film can be considered as a complex electrochemical system of the first equivalent electrical circuit model. Accordingly, the thickness of the film can be in-situ estimated by equation (2) based on the impedance data collected during the CMP operation.

Figure 8:
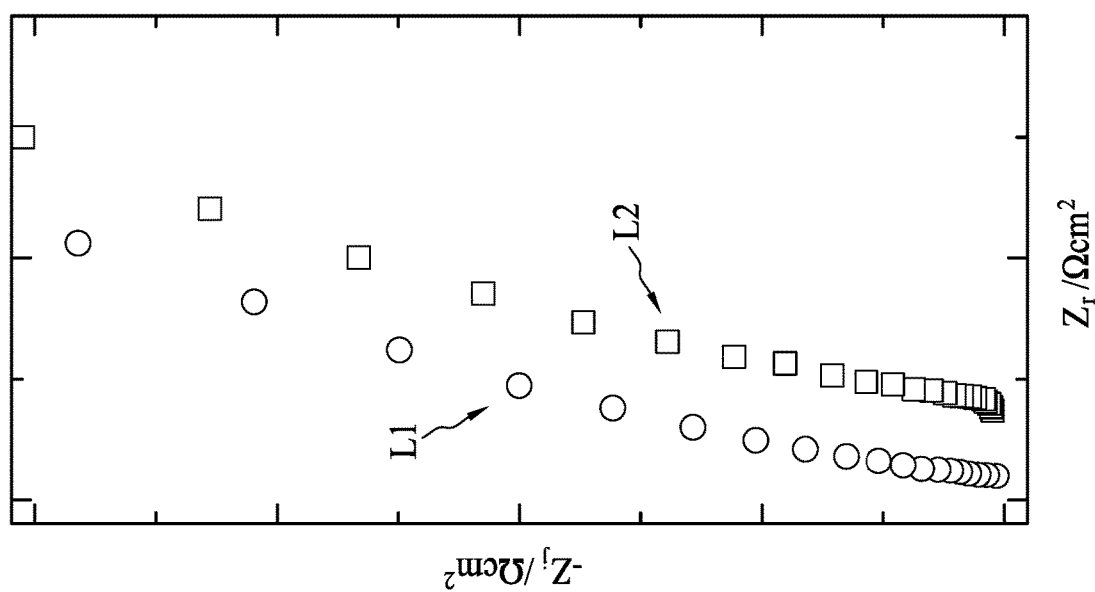
FIG. 8 is a Nyquist plot representing an impedance data of the electrical circuit path in the slurry and the film collected during the CMP operation in accordance with some embodiments of the present disclosure.

Refer to FIG. 8, FIG. 8 is a Nyquist plot representing an impedance data of the electrical circuit path in the slurry and the film collected during the CMP operation in accordance with some embodiments of the present disclosure, where two sets of impedance data L1 and L2 collected at different time periods are illustrated. As shown in FIG. 8, when the curve of the impedance data resulting from the electrical circuit path in the slurry and the film during the CMP operation substantially resembles the profile of a ⅛ circle, the electrical circuit path in the slurry and the film is considered to be fitting the first equivalent electrical circuit model. Accordingly, the first parameter α and the second fit parameter Q of the first equivalent electrical circuit model representing the complex electrochemical system formed by the film and the slurry can be obtained by regression analysis such as least square fitting or the like. As long as the first parameter α and the second fit parameter Q of the first equivalent electrical circuit model representing the complex electrochemical system formed by the film and the slurry are known, the thickness of the film can be obtained by equation (2).

Refer to Table 1. Table 1 compares the estimated thickness of the film from the impedance data L1 and L2 with the actual thickness of the film in accordance with some embodiments of the present disclosure.

TABLE 1

| Actual thickness | Estimated thickness | Error |
|---|---|---|
| 400A | 409A | 2.25% |
| 200A | 197A | 1.50% |

In an exemplary process as shown in Table 1, when an actual thickness of the film is 400A, the thickness of the film estimated by the impedance data L1 is 409A; when an actual thickness of the film is 200A, the thickness of the film estimated by the impedance data L1 is 197A. Furthermore, as the thickness of the film is thinner, the method of the present disclosure can be even more accurate in estimating the thickness of the film.

The impedance data of the electrical circuit path in the slurry and the film collected during the CMP operation might not always fit to the first equivalent electrical circuit model due to other factors. For example, the electrical circuit path in the slurry and the film may be affected by charges accumulated in the film. When charges exist in the film, the electrical circuit path in the slurry and the film may form another complex electrochemical system.

Figure 9:
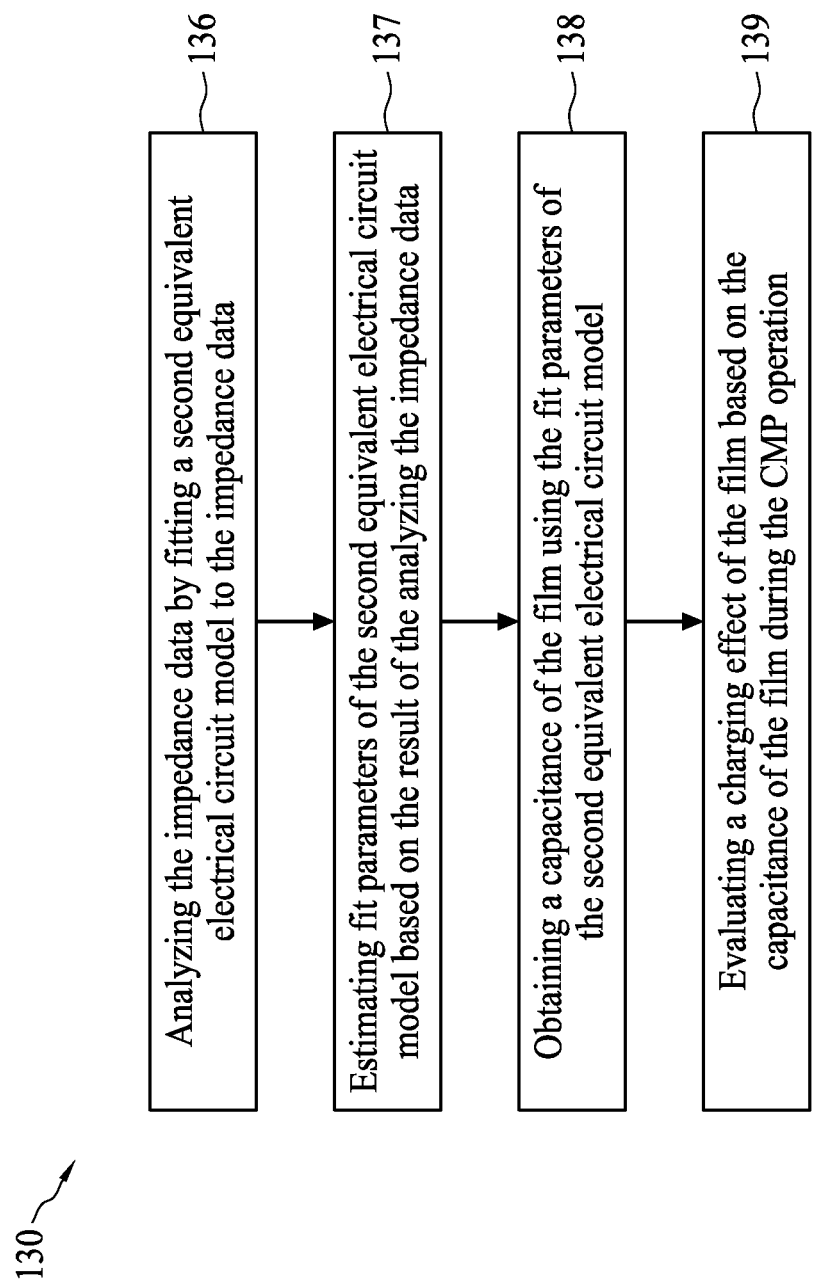
FIG. 9 is a flowchart illustrating sub-operations of the in-situ EIS measurement in accordance with some embodiments of the present disclosure.

Refer to FIG. 9. FIG. 9 is a flowchart illustrating sub-operations of the in-situ EIS measurement in accordance with some embodiments of the present disclosure. As shown in FIG. 9, the EIS measurement in operation 130 of the method 100 may further proceed with sub-operation 136 in which the impedance data is analyzed by fitting a second equivalent electrical circuit model to the impedance data. The EIS measurement in operation 130 of the method 100 may continue with sub-operation 137 in which fit parameters of the second equivalent electrical circuit model are estimated based on the result of the analyzing the impedance data. The EIS measurement in operation 130 of the method 100 may continue with sub-operation 138 in which a capacitance of the film is obtained using the fit parameters of the second equivalent electrical circuit model. The EIS measurement in operation 130 of the method 100 may proceed with sub-operation 139 in which a charging effect of the film is evaluated based on the capacitance of the film during the CMP operation.

Figure 10:
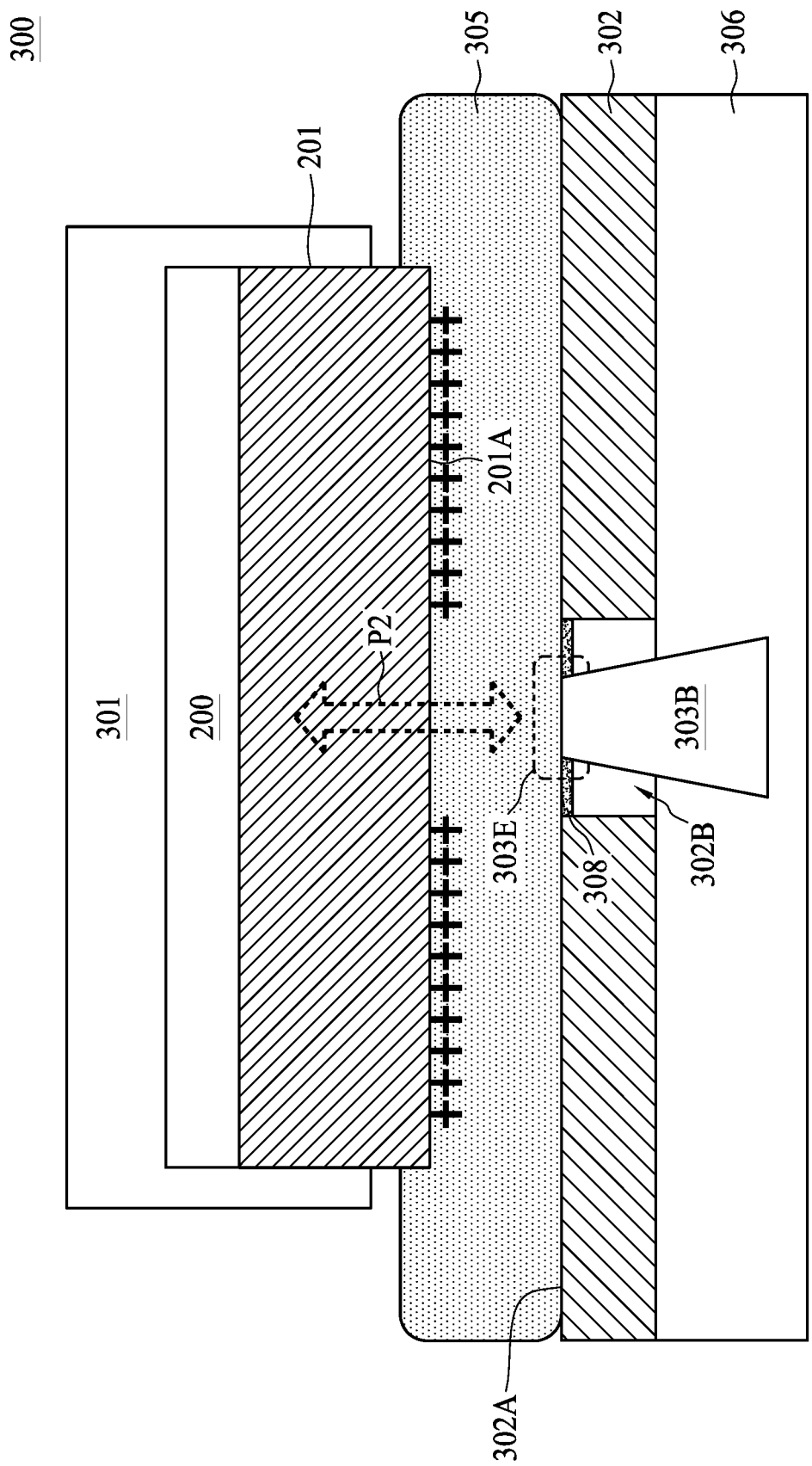
FIG. 10 is a schematic view of a CMP apparatus in accordance with some embodiments of the present disclosure.

Referring to FIG. 10. FIG. 10 is a schematic view of a CMP apparatus in accordance with some embodiments of the present disclosure. As shown in FIG. 10, in case charges appear in the film 201, an electrical circuit path P2 may be formed in the slurry 305 and the film 201 during the CMP operation. The EIS device 303 is configured to in-situ obtain an impedance data of an electrical circuit path P2 in the slurry 305 and the film 201 during a CMP operation, and configured to analyze the impedance data. Based on the result of the impedance data analysis, the capacitance of the film can be obtained, and a charging effect can be evaluated.

Figure 11:
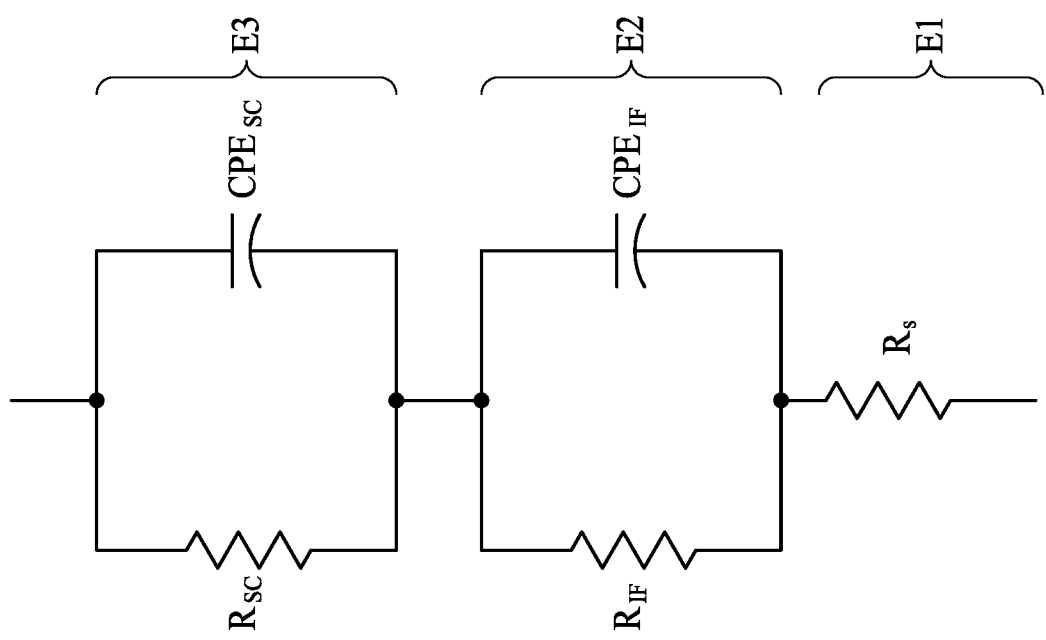
FIG. 11 depicts a second equivalent electrical circuit model of a complex electrochemical system in accordance with some embodiments of the present disclosure.

Referring to FIG. 11, FIG. 11 depicts a second equivalent electrical circuit model of a complex electrochemical system in accordance with some embodiments of the present disclosure. As shown in FIG. 11, the second equivalent electrical circuit model includes a first impedance E1, a second impedance E2 and a third impedance E3 connected in series. The first impedance E1 includes a slurry resistance Rs in the slurry 305. The second impedance E2 includes an interface constant phase element $CPE_{IF}$ at an interface between the slurry 305 and the film 201, and an interface resistance $R_{IF}$ at the interface between the slurry 305 and the film 201 connected to each other in parallel. The third impedance E3 includes a film constant phase element $CPE_{SC}$ of the film 305, and a film resistance $R_{SC}$ of the film 305 connected to each other in parallel. Theoretically, the impedance of the film in the second equivalent electrical circuit model can be expressed by equation (3):

$$Z = \frac{1}{(j\omega)^\alpha Q}, \quad (3)$$

where

Z is the impedance of the film CPE;

j is an imaginary unit;

ω is a radial frequency;

α is a first fit parameter of the second equivalent electrical circuit model; and Q is a second fit parameter of the second equivalent electrical circuit model.

In the second equivalent electrical circuit model of FIG. 11, a theoretical capacitance of the film can be derived from equation (4):

$$C = Q^{1/\alpha} R_s^{(1-\alpha)/\alpha} \quad (4),$$

where

C is the capacitance of the film; and

Rs is the resistance of the slurry.

The Nyquist plot of the second equivalent electrical circuit model as depicted in FIG. 11 is a curve substantially having a profile of a semicircle, and the curve can be expressed by equation (3). If the impedance data of the electrical circuit path in the slurry and the film collected during the CMP operation fits to the Nyquist plot of the second equivalent electrical circuit model by curve fitting, the electrical circuit path in the slurry and the film can be considered as a complex electrochemical system of the second equivalent electrical circuit model. Accordingly, the capacitance of the film can be in-situ estimated by equation (4) based on the impedance data collected during the CMP operation.

Figure 12:
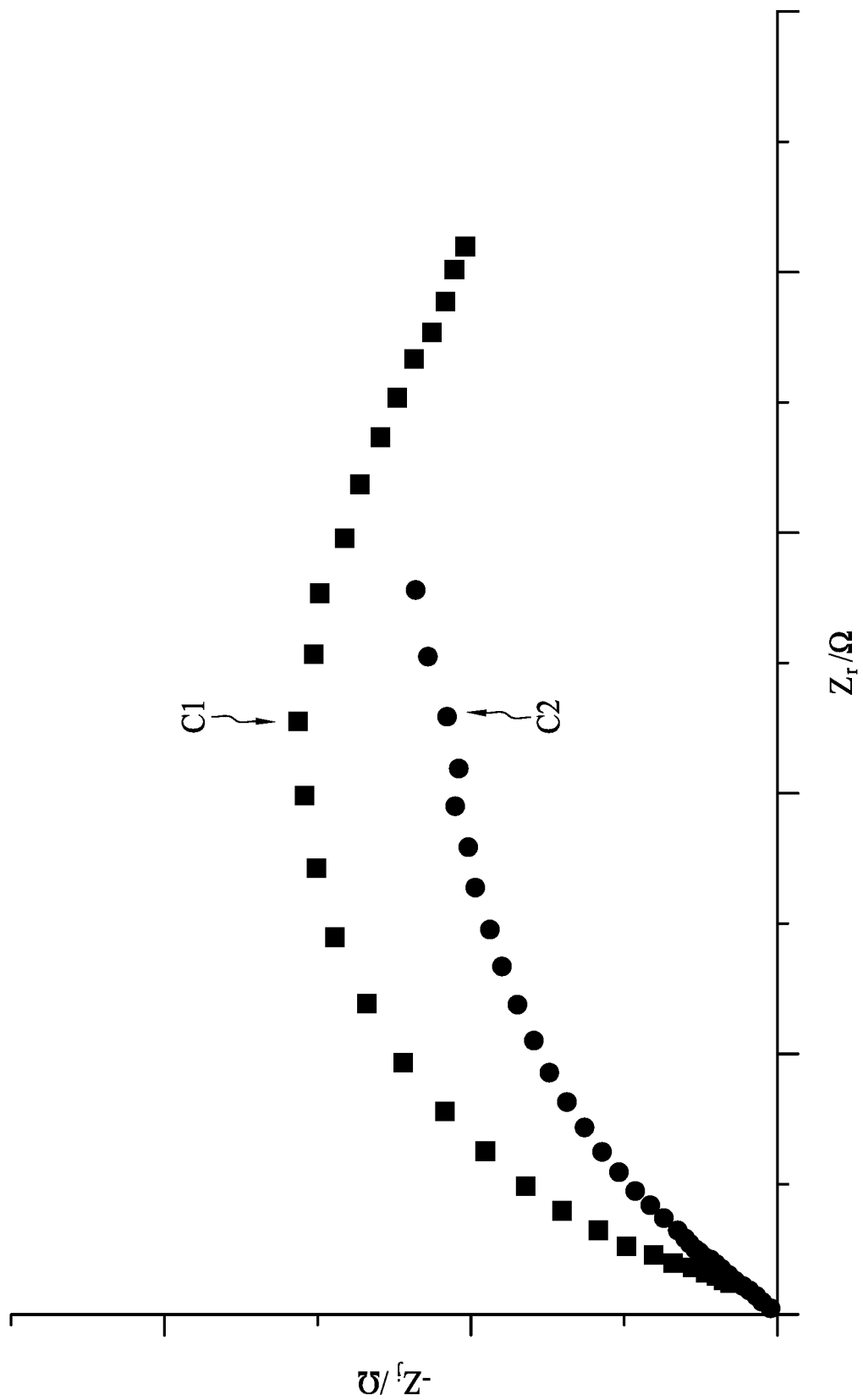
FIG. 12 is a Nyquist plot representing an impedance data of the electrical circuit path in the slurry and the film collected during the CMP operation in accordance with some embodiments of the present disclosure.

Referring to FIG. 12, FIG. 12 is a Nyquist plot representing an impedance data of the electrical circuit path in the slurry and the film collected during the CMP operation in accordance with some embodiments of the present disclosure, where two sets of impedance data C1 and C2 collected are illustrated. As shown in FIG. 12, when the curve of the impedance data resulting from the electrical circuit path in the slurry and the film during the CMP operation substantially resembles a shape of a semicircle, the electrical circuit path in the slurry and the film is considered to be fitting the second equivalent electrical circuit model. Accordingly, the first parameter α and the second fit parameter Q of the second equivalent electrical circuit model representing the complex electrochemical system formed by the film with charges and the slurry can be obtained by regression analysis such as least square fitting or the like. As long as the first parameter α and the second fit parameter Q of the second equivalent electrical circuit model representing the complex electrochemical system formed by the film with charges and the slurry are known, the capacitance of the film can be obtained by equation (4). In some embodiments, the capacitance estimated by equation (4) based on the impedance data C1 is about 13 uF, and the capacitance estimated by equation (4) based on the impedance data C2 is about 25 uF.

Figure 13B:
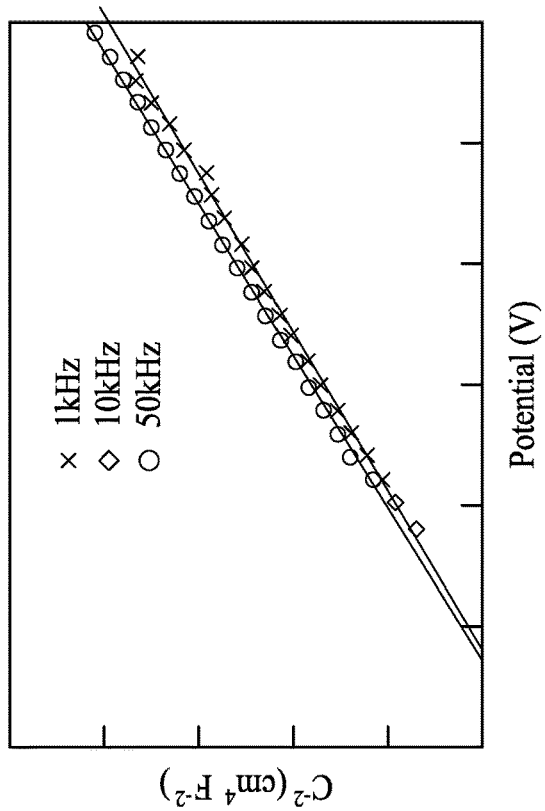
FIG. 13A and FIG. 13B are Mott-Schottky plots of the film with charges in accordance with some embodiments of the present disclosure.
Figure 13A:
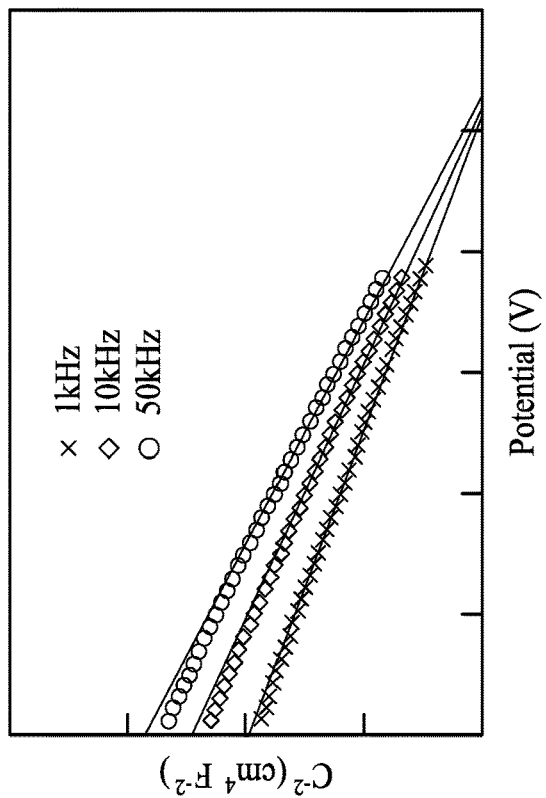

Referring to FIG. 13A and FIG. 13B, FIG. 13A and FIG. 13B are Mott-Schottky plots of the film with charges in accordance with some embodiments of the present disclosure. The Mott-Schottky plot can be plotted based on the capacitance estimated by equation (4) using the impedance data fitting to the second equivalent electrical circuit model and the voltage applied to the film. As shown in FIG. 13A, when the slope is negative in the Mott-Schottky plot, it may refer that positive charges exist on the surface of the film. On the other hand, as shown in FIG. 13B, when the slope is positive in the Mott-Schottky plot, it may refer that negative charges appear to the surface of the film.

The charging effect of the film thus can be evaluated based on the capacitance of the film based on the capacitance estimated by equation (4) using the impedance data fitting to the second equivalent electrical circuit model and the voltage applied to the film during the CMP operation. The charges in the surface of the film may be released or neutralized by additional operation, if the charges has adverse influence on the CMP operation or other subsequent operations. In some embodiments, the contents of the slurry can be modified based on the result of the charging effect evaluation. For example, when the film is a metal film, positive charges appearing in the film may lead to corrosion to the metal. In such case, the concentration of the corrosion inhibitor in the slurry can be modified to inhibit corrosion to the film during the CMP operation.

In some embodiments, an implantation operation can be performed on the film to add dopants with opposite doping type to neutralize the charges in the film. After the charges of the film is released or neutralized, the impedance data of the film and the slurry can be obtained again. If the impedance data of the electrical circuit path in the slurry and the film collected during the CMP operation fit to the first equivalent electrical circuit model, the thickness of the film can be in-situ estimated. Accordingly, the CMP operation can be ended when the estimated thickness reaches the target thickness.

In some embodiments of the present disclosure, a chemical-mechanical planarization (CMP) apparatus and a method for estimating film thickness are provided. An EIS device is incorporated in the CMP apparatus and configured to in-situ obtain an impedance data of a complex electrochemical system from the film to be polished and the slurry for polishing the film. The impedance data may be fitted to a predetermined equivalent electrical circuit model. When the impedance data fits to the predetermined equivalent electrical circuit model, the thickness of the film can be estimated by an equation derived from the predetermined equivalent electrical circuit model. The EIS analysis is executed repeatedly during the CMP operation. The impedance data vary due to the changes in thickness, and the thickness of the film can be real-time estimated. As the estimated thickness of the film reaches the target thickness, the CMP operation can be stopped promptly. The thickness of the film is estimated based on the impedance data of the complex electrochemical system formed from the film and the slurry, and therefore can be applied to an CMP operation for planarizing a film without an etching top layer.

In some embodiments, a method for estimating film thickness in chemical-mechanical planarization (CMP) includes the following operations. A substrate with a film formed thereon is disposed over a polishing pad of a CMP apparatus with a slurry dispensed between the film and the polishing pad. A CMP operation is performed to reduce a thickness of the film. An in-situ electrochemical impedance spectroscopy (EIS) measurement is performed during the CMP operation by an EIS device. The in-situ EIS measurement includes the following operations. An alternating voltage is applied to an electrical circuit path in the slurry and the film at different frequencies. An impedance data of the electrical circuit path responsive to the alternating voltage at different frequencies is collected. The impedance data is analyzed by fitting a first equivalent electrical circuit model to the impedance data. Fit parameters of the first equivalent electrical circuit model are estimated based on a result of the analyzing the impedance data. An estimated thickness of the film is obtained using the fit parameters of the first equivalent electrical circuit model. The CMP operation is ended when the estimated thickness of the film obtained from the fit parameters of the first equivalent electrical circuit model reaches a target thickness.

In some embodiments, a chemical-mechanical planarization (CMP) apparatus includes a polishing head, a platen, a polishing pad, a slurry delivery system and an electrochemical impedance spectroscopy (EIS) device. The polishing head is configured to hold a substrate with a film formed thereon. The platen is arranged in opposite to the polishing head. The polishing pad is supported by the platen and configured to polish the film. The slurry delivery system is configured to supply a slurry over the polishing pad. The EIS device is configured to in-situ obtain an impedance data of an electrical circuit path in the slurry and the film during a CMP operation, and configured to analyze the impedance data.

In some embodiments, a chemical-mechanical planarization (CMP) apparatus includes a polishing head, a platen, a polishing pad and a probe. The polishing head is configured to hold a film. The platen is arranged opposing the polishing head. The polishing pad is supported by the platen and configured to polish the film. The probe is arranged in the platen and configured to collect an impedance data of the film. The probe includes an end extending toward the polishing pad, wherein the end of the probe is exposed through a polishing surface of the polishing pad to contact a slurry.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for estimating film thickness in chemical-mechanical planarization (CMP), comprising:
    disposing a substrate with a film formed thereon over a polishing pad of a CMP apparatus with a slurry dispensed between the film and the polishing pad;
    performing a CMP operation to reduce a thickness of the film;
    performing an in-situ electrochemical impedance spectroscopy (EIS) measurement during the CMP operation by an EIS device, wherein the in-situ EIS measurement comprises:
        applying an alternating voltage to an electrical circuit path in the slurry and the film at different frequencies;
        collecting an impedance data of the electrical circuit path responsive to the alternating voltage at different frequencies;
        analyzing the impedance data by fitting a first equivalent electrical circuit model to the impedance data;
        estimating fit parameters of the first equivalent electrical circuit model based on a result of the analyzing the impedance data; and
        obtaining an estimated thickness of the film using the fit parameters of the first equivalent electrical circuit model; and
    ending the CMP operation when the estimated thickness of the film obtained from the fit parameters of the first equivalent electrical circuit model reaches a target thickness,
    wherein the in-situ EIS measurement further comprises:
    analyzing the impedance data by fitting a second equivalent electrical circuit model to the impedance data;
    estimating fit parameters of the second equivalent electrical circuit model based on the result of the analyzing the impedance data;
    obtaining a capacitance of the film using the fit parameters of the second equivalent electrical circuit model; and
    evaluating a charging effect of the film based on the capacitance of the film during the CMP operation.

2. The method of claim 1, wherein the first equivalent electrical circuit model comprises a slurry resistance of the slurry, a film constant phase element (CPE) of the film and a film resistance of the film connected to each other in parallel, and the film CPE and the film resistance are connected to the slurry resistance in series.

3. The method of claim 2, wherein an impedance of the film is expressed by an equation (1):

$$Z = \frac{1}{(j\omega)^\alpha Q}, \qquad (1)$$

wherein
    Z is the impedance of the film CPE;
    j is an imaginary unit;
    $\omega$ is a radial frequency;
    $\alpha$ is a first fit parameter of the first equivalent electrical circuit model, wherein $0<\alpha<1$;
and
    Q is a second fit parameter of the first equivalent electrical circuit model.

4. The method of claim 3, wherein the first fit parameter $\alpha$ and the second fit parameter Q are obtained by regression analysis.

5. The method of claim 4, wherein the estimated thickness of the film is derived from an equation (2):

$$\delta = \frac{(\epsilon\epsilon_0)^\alpha}{gQ\rho^{1-\alpha}}, \qquad (2)$$

wherein
    $\delta$ is the estimated thickness of the film;
    g is a parameter equal to $1+2.88(1-\alpha)^{2.375}$;
    $\epsilon$ is a dielectric constant of the film;
    $\epsilon_0$ is the permittivity of vacuum; and
    $\rho$ is a resistivity at film-slurry interface.

6. The method of claim 1, wherein the second equivalent electrical circuit model comprises a first impedance, a second impedance and a third impedance connected in series, the first impedance comprises a slurry resistance, the second impedance comprises an interface CPE at an interface between the slurry and the film, and an interface resistance at the interface between the slurry and the film connected to each other in parallel, and the third impedance comprises a film CPE of the film, and a film resistance of the film connected to each other in parallel.

7. The method of claim 6, wherein an impedance of the film is expressed by an equation (3):

$$Z = \frac{1}{(j\omega)^\alpha Q}, \qquad (3)$$

wherein
    Z is the impedance of the film CPE;
    j is an imaginary unit;

ω is a radial frequency;
α is a first fit parameter of the second equivalent electrical circuit model, wherein 0<α<1;
and
Q is a second fit parameter of the second equivalent electrical circuit model.

8. The method of claim 7, wherein the capacitance of the film is derived from an equation (4):

$$C=Q^{1/\alpha}R_s^{(1-\alpha)/\alpha},$$

wherein,
C is a capacitance of the film, and
$R_s$ is the slurry resistance.

9. The method of claim 1, wherein the EIS device comprises a probe installed in a platen of the CMP apparatus, the probe is extended toward the polishing pad, exposed through the polishing pad, and in contact with the slurry.

10. The method of claim 9, wherein the probe and the film are contactless when the alternating voltage is applied to the electrical circuit path.

11. A method for estimating film thickness in chemical-mechanical planarization (CMP), comprising:
disposing a substrate with a film formed thereon over a polishing pad of a CMP apparatus with a slurry dispensed between the film and the polishing pad;
performing a CMP operation to reduce a thickness of the film;
performing an electrochemical impedance spectroscopy (EIS) measurement, comprising:
applying an alternating voltage to an electrical circuit path in the slurry and the film at different frequencies;
collecting an impedance data of the electrical circuit path responsive to the alternating voltage at different frequencies;
analyzing the impedance data by fitting a first equivalent electrical circuit model to the impedance data;
estimating fit parameters of the first equivalent electrical circuit model based on a result of the analyzing the impedance data; and
obtaining an estimated thickness of the film using the fit parameters of the first equivalent electrical circuit model; and
ending the CMP operation when the estimated thickness of the film obtained from the fit parameters of the first equivalent electrical circuit model reaches a target thickness,
wherein the first equivalent electrical circuit model comprises a slurry resistance of the slurry, a film constant phase element (CPE) of the film and a film resistance of the film connected to each other in parallel, and the film CPE and the film resistance are connected to the slurry resistance in series, and
wherein an impedance of the film is expressed by an equation (1):

$$Z=\frac{1}{(j\omega)^\alpha Q},$$

wherein
Z is the impedance of the film CPE;
j is an imaginary unit;
ω is a radial frequency;
α is a first fit parameter of the first equivalent electrical circuit model, wherein 0<α<1;
and
Q is a second fit parameter of the first equivalent electrical circuit model.

12. The method of claim 11, wherein the estimated thickness of the film is derived from an equation (2):

$$\delta=\frac{(\epsilon\epsilon_0)^\alpha}{gQ\rho^{1-\alpha}},$$

wherein
δ is the estimated thickness of the film;
g is a parameter equal to $1+2.88(1-\alpha)^{2.375}$;
ε is a dielectric constant of the film;
$\epsilon_0$ is the permittivity of vacuum; and
ρ is a resistivity at film-slurry interface.

13. The method of claim 11, wherein the EIS measurement further comprises:
analyzing the impedance data by fitting a second equivalent electrical circuit model to the impedance data;
estimating fit parameters of the second equivalent electrical circuit model based on the result of the analyzing the impedance data;
obtaining a capacitance of the film using the fit parameters of the second equivalent electrical circuit model; and
evaluating a charging effect of the film based on the capacitance of the film during the CMP operation.

14. The method of claim 13, wherein the second equivalent electrical circuit model comprises a first impedance, a second impedance and a third impedance connected in series, the first impedance comprises a slurry resistance, the second impedance comprises an interface CPE at an interface between the slurry and the film, and an interface resistance at the interface between the slurry and the film connected to each other in parallel, and the third impedance comprises a film CPE of the film, and a film resistance of the film connected to each other in parallel.

15. The method of claim 14, wherein an impedance of the film is expressed by an equation (3):

$$Z=\frac{1}{(j\omega)^\alpha Q},$$

wherein
Z is the impedance of the film CPE;
j is an imaginary unit;
ω is a radial frequency;
α is a first fit parameter of the second equivalent electrical circuit model, wherein 0<α<1;
and
Q is a second fit parameter of the second equivalent electrical circuit model.

16. The method of claim 15, wherein the capacitance of the film is derived from an equation (4):

$$C=Q^{1/\alpha}R_s^{(1-\alpha)/\alpha},$$

wherein,
C is a capacitance of the film, and
$R_s$ is the slurry resistance.

17. A method for estimating film thickness in chemical-mechanical planarization (CMP), comprising:
disposing a substrate with a film formed thereon over a polishing pad of a CMP apparatus with a slurry dispensed between the film and the polishing pad;

performing a CMP operation to reduce a thickness of the film;

performing an electrochemical impedance spectroscopy (EIS) measurement during the CMP operation by an EIS device, wherein the EIS device comprises a probe installed in a platen of the CMP apparatus, the probe is extended toward the polishing pad, exposed through the polishing pad, and in contact with the slurry wherein the EIS measurement comprises:

applying an alternating voltage to an electrical circuit path in the slurry and the film at different frequencies, wherein the probe and the film are contactless when the alternating voltage is applied to the electrical circuit path;

collecting an impedance data of the electrical circuit path responsive to the alternating voltage at different frequencies;

analyzing the impedance data by fitting a first equivalent electrical circuit model to the impedance data;

estimating fit parameters of the first equivalent electrical circuit model based on a result of the analyzing the impedance data; and obtaining an estimated thickness of the film using the fit parameters of the first equivalent electrical circuit model; and ending the CMP operation when the estimated thickness of the film obtained from the fit parameters of the first equivalent electrical circuit model reaches a target thickness, wherein the EIS measurement further comprises:

analyzing the impedance data by fitting a second equivalent electrical circuit model to the impedance data;

estimating fit parameters of the second equivalent electrical circuit model based on the result of the analyzing the impedance data;

obtaining a capacitance of the film using the fit parameters of the second equivalent electrical circuit model; and evaluating a charging effect of the film based on the capacitance of the film during the CMP operation.

18. The method of claim 17, wherein an impedance of the film is expressed by an equation (1):

$$Z = \frac{1}{(j\omega)^\alpha Q}, \qquad (1)$$

wherein

Z is the impedance of the film CPE;

j is an imaginary unit;

$\omega$ is a radial frequency;

$\alpha$ is a first fit parameter of the first equivalent electrical circuit model, wherein $0<\alpha<1$; and Q is a second fit parameter of the first equivalent electrical circuit model.

19. The method of claim 18, wherein the first equivalent electrical circuit model comprises a slurry resistance of the slurry, a film constant phase element (CPE) of the film and a film resistance of the film connected to each other in parallel, and the film CPE and the film resistance are connected to the slurry resistance in series.

20. The method of claim 17, wherein an end of the probe is substantially coplanar with a polishing surface of the polishing pad.

* * * * *